United States Patent
Suzuki et al.

(10) Patent No.: US 7,838,311 B2
(45) Date of Patent: Nov. 23, 2010

(54) PROCESS FOR PRODUCING LIGHT-EMITTING SEMICONDUCTOR DEVICE

(75) Inventors: Akiko Suzuki, Tokyo (JP); Shinetsu Fujieda, Kawasaki (JP); Tatsuoki Kono, Tokyo (JP); Toshihide Takahashi, Yokohama (JP); Kazuaki Ootsuka, Yokosuka (JP); Hiroaki Oshio, Yokohama (JP); Hideo Tamura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 177 days.

(21) Appl. No.: 12/343,191

(22) Filed: Dec. 23, 2008

(65) Prior Publication Data

US 2009/0176323 A1   Jul. 9, 2009

(30) Foreign Application Priority Data

Dec. 27, 2007   (JP) .......................... P2007-338043

(51) Int. Cl.
*H01L 21/00* (2006.01)
(52) U.S. Cl. ........................................ 438/26; 438/127
(58) Field of Classification Search ............ 438/25–26, 438/106–127
See application file for complete search history.

(56) References Cited

U.S. PATENT DOCUMENTS

| | | | | |
|---|---|---|---|---|
| 4,632,798 A | * | 12/1986 | Eickman et al. | 264/272.17 |
| 5,447,576 A | * | 9/1995 | Willis | 136/259 |
| 5,895,228 A | * | 4/1999 | Biebuyck et al. | 438/99 |
| 2008/0297047 A1 | | 12/2008 | Kohno et al. | |
| 2008/0303044 A1 | | 12/2008 | Kohno et al. | |

FOREIGN PATENT DOCUMENTS

| | | |
|---|---|---|
| JP | 2-14834 | 1/1990 |
| JP | 2003-313233 | 11/2003 |
| JP | 2004-168953 | 6/2004 |
| JP | 2004-339319 | 12/2004 |

\* cited by examiner

*Primary Examiner*—Richard A. Booth
(74) *Attorney, Agent, or Firm*—Finnegan, Henderson, Farabow, Garrett & Dunner, L.L.P.

(57) ABSTRACT

A process for producing a light-emitting semiconductor device includes: (i) mixing at least one low-molecular silane or at least one silanol with an alcohol solution containing an alkoxysiloxane to prepare a mixture solution, the amount of the silane or silanol being from 10% by weight to 50% by weight based on the dry weight of an encapsulating material to be formed; (ii) applying the mixture solution to a light-emitting element; (iii) vaporizing the alcohol solvent in the mixture solution applied and drying the residual mixture to thereby form the encapsulating material; and (iv) curing the encapsulating material.

6 Claims, 2 Drawing Sheets

PROCESS FOR PRODUCING LIGHT-EMITTING SEMICONDUCTOR DEVICE

CROSS-REFERENCE TO RELATED APPLICATIONS

This application is based upon and claims the benefit of priority from the prior Japanese Patent Application No. 2007-338043, filed on Dec. 27, 2007, the entire contents of which are incorporated herein by reference.

BACKGROUND OF THE INVENTION

1. Field

The present invention relates to a process for producing a light-emitting semiconductor device.

2. Description of the Related Art

In light-emitting semiconductor devices such as light-emitting diodes and semiconductor lasers, light-emitting elements are usually covered with an encapsulating material for the purposes of protection and color alteration. A white-light-emitting semiconductor device is constituted of a blue-light-emitting element and an encapsulating material formed so as to cover the element and containing a yellow fluorescent substance. For forming this encapsulating material in such white-light-emitting semiconductor devices, epoxy resins have hitherto been generally used (see, JP-A 2004-339319 (KOKAI)).

However, the blue-light-emitting element for use in white-light-emitting semiconductor devices emits near ultraviolet rays besides blue light, and there have hence been the following problems. That part of the epoxy-resin encapsulating material which is located near the blue-light-emitting element yellows, or the encapsulating material is thermally deteriorated by the heat emitted by the blue-light emitting element. In applications where high brightness is required, such as electric lamps, the quantity of light emitted by the blue-light-emitting element is large and yellowing and thermal deterioration have been apt to occur.

Because of this, investigations have been made on silicone-resin encapsulating materials as an encapsulating material which is not yellowed by near ultraviolet rays even when placed in a high-brightness environment and has heat resistance. However, a silicone resin formed from dimethylsiloxane has poor adhesion to light-emitting elements and substrates. Furthermore, this silicone resin has tackiness and, hence, dust particles and other substances are apt to adhere thereto. In addition, there have been cases where the carbon-carbon bonds formed during crosslinking are cleaved by near ultraviolet rays to impair the performance of the encapsulating material.

On the other hand, a polysiloxane film formed by the hydrolysis/condensation of an alkoxysilane monomer is apt to crack when thick, and has hence been undesirable for use as an encapsulating material for light-emitting elements.

BRIEF SUMMARY OF THE INVENTION

The invention may provide a process for producing a light-emitting semiconductor device, comprising: (i) mixing at least one low-molecular silane represented by the following general formula (1) or at least one silanol represented by the following general formula (2) with an alcohol solution containing an alkoxysiloxane to prepare a mixture solution, the amount of the silane or silanol being from 10% by weight to 50% by weight based on the dry weight of an encapsulating material to be formed; (ii) applying the mixture solution to a light-emitting element; (iii) vaporizing the alcohol solvent in the mixture solution applied and drying the residual mixture to thereby form the encapsulating material; and (iv) curing the encapsulating material.

(1)

In general formula (1), $R_1$s each independently represent a methyl group or an ethyl group; and $R_2$ represents an alkyl group having 1-20 carbon atoms or a phenyl group which may have one or more hydrocarbon groups each having 1-8 carbon atoms.

(2)

In general formula (2), $R_3$ represents an ethyl group.

In the process for producing a light-emitting semiconductor device of embodiments of the invention, the mixture solution may further comprise a fluorescent substance and a filler.

It is desirable that in the process for producing a light-emitting semiconductor device of embodiments of the invention, the mixture solution comprises the fluorescent substance in an amount of from 40% by weight to 80% by weight based on the dry weight of the encapsulating material.

The mixture solution may comprise the filler in an amount of from 0.1% by weight to 20% by weight based on the dry weight of the encapsulating material.

The fluorescent substance preferably has an average particle diameter of from 5 μm to 30 μm.

The filler desirably has an average particle diameter of from 0.001 μm to 0.1 μm.

According to the process of embodiments of the invention for producing a light-emitting semiconductor device, a light-emitting semiconductor device reduced in encapsulating-material cracking can be provided.

DETAILED DESCRIPTION OF THE INVENTION

Modes for carrying out the embodiments of the invention will be explained below. However, the invention should not be construed as being limited to the modes.

Figure 1:
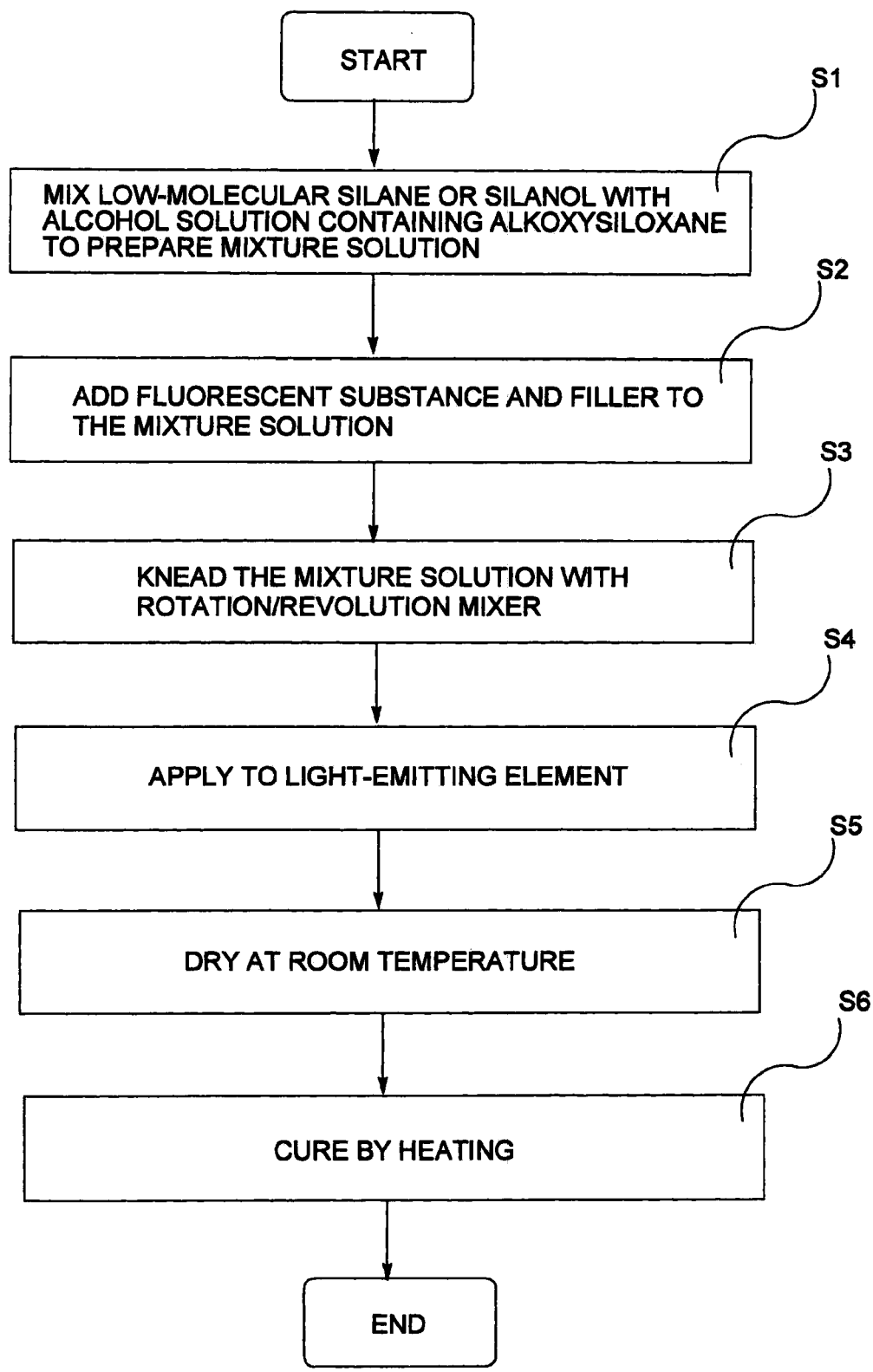
FIG. 1 is a flowchart showing one embodiment of the process of the invention for producing a light-emitting semiconductor device.

In FIG. 1 is shown a flowchart illustrating one embodiment of a process of the invention for producing a light-emitting semiconductor device. However, the invention should not be construed as being limited to the flowchart.

An alcohol solution containing an alkoxysiloxane is mixed with at least one low-molecular silane represented by general formula (1) or at least one silanol represented by general formula (2) to prepare a mixture solution (S1).

(1)

In general formula (1), $R_1$s each independently represent a methyl group or an ethyl group; and $R_2$ represents an alkyl group having 1-20 carbon atoms or a phenyl group which may have one or more hydrocarbon groups each having 1-8 carbon atoms.

Examples of the alkyl group having 1-20 carbon atoms include methyl, ethyl, propyl, isopropyl, butyl, isobutyl, s- or t-butyl, pentyl, isopentyl, neopentyl, octyl, isooctyl, dodecyl, and tetradecyl. Preferred of these are the alkyl groups having 1-12 carbon atoms. More preferred are the alkyl groups having 2-8 carbon atoms.

Examples of the phenyl group which may have one or more hydrocarbon groups each having 1-8 carbon atoms include phenyl, tolyl, xylyl, and cumenyl, and further include phenyl groups having one or more of substituents such as methyl, ethyl, propyl, butyl, isobutyl, pentyl, hexyl, heptyl, octyl, and the like.

In the low-molecular silane represented by general formula (1), $R_2$ preferably is an alkyl group having 2-8 carbon atoms or a phenyl group which may have one or more hydrocarbon groups each having 1 or 2 carbon atoms.

Examples of the low-molecular silane represented by general formula (1) include ones in which the three $R_1$s are methyl or ethyl or are two methyl groups and one ethyl group or are one methyl group and two ethyl groups and in which $R_2$ is ethyl, isobutyl, isooctyl, phenyl, or the like.

Low-molecular silanes represented by general formula (1), which have the groups described above, may be used alone or in combination of two or more thereof.

The alkoxysiloxane is a compound having Si—O bonds (siloxane bonds) in which a silicon atom (Si) and an oxygen atom (O) are alternatively bonded and having alkoxy groups in the molecule. Specifically, a poly(dialkoxysiloxane) or a poly(alkyl(aryl)alkoxysiloxane) is preferred. Examples of the poly(dialkoxysiloxane) include poly(diethoxysiloxane), poly(dipropoxysiloxane), poly(di-t-butoxysiloxane), and poly(ethoxybutoxysiloxane). Of these, poly(di-t-butoxysiloxane) is preferred because it has excellent storage stability as a raw material. Alkoxysiloxanes differ considerably in viscosity depending on their molecular weights and structures and, hence, are diluted with an ordinary solvent such as an alcohol. Examples of the alcohol solvent to be used include methanol, ethanol, n-propyl alcohol, isopropyl alcohol, isobutyl alcohol, n-butyl alcohol, sec-butyl alcohol, t-butyl alcohol, n-hexyl alcohol, n-octyl alcohol, ethylene glycol, diethylene glycol, triethylene glycol, ethylene glycol monobutyl ether, ethylene glycol monoethyl ether acetate, diethylene glycol monoethyl ether, propylene glycol monomethyl ether, propylene glycol monomethyl ether acetate, and diacetone alcohol. More preferred are isopropyl alcohol, methanol, and n-butanol. The concentration of the alkoxysiloxane may be in the range of 70-90% by weight, and the concentration of the alcohol solvent may be 30-10% by weight.

The alkoxysiloxane is preferably mixed in such an amount as to result in a content thereof of from more than 50% by weight to less than 90% by weight based on the dry weight of the encapsulating material.

Specific examples of the low-molecular silane represented by general formula (1) include methyltrimethoxysilane, methyltriethoxysilane, methyl-tripropoxysilane, methyltri-isopropoxysilane, ethyl-trimethoxysilane, ethyltriethoxysilane, propyltriethoxy-silane, 3,3,3-trifluoropropyltrimethoxysilane, 3,3,3-trifluoropropyltriethoxysilane, perfluorooctylethyl-triethoxysilane, butyltrimethoxysilane, isobutyltrimethoxy-silane, isobutyltriethoxysilane, pentyltrimethoxysilane, pentyltriethoxysilane, cyclopentyltrimethoxysilane, cyclo-pentyltriethoxysilane, hexyltrimethoxysilane, hexyltriethoxysilane, cyclohexyltrimethoxysilane, cyclohexyltriethoxysilane, phenyltrimethoxysilane, phenyltriethoxysilane, benzyltrimethoxysilane, benzyltriethoxysilane, octyltrimethoxysilane, octyltriethoxysilane, trimethoxysilane, triethoxysilane, tri-n-propoxysilane, triisopropoxysilane, tributoxysilane, triisopropenoxysilane, diethoxypropenoxysilane, methyldimethoxysilane, methyldiethoxysilane, methyldi-n-propoxysilane, methyldiisopropenoxysilane, methyldi(2-methoxyethoxy)silane, ethyldimethoxysilane, ethyldiethoxysilane, n-propyldimethoxysilane, n-propyl-diethoxyhexyldimethoxysilane, hexyldiethoxysilane, octyl-dimethoxysilane, and octyldiethoxysilane. However, the low-molecular silane represented by general formula (1) should not be construed as being limited to these examples.

More preferred are ethyltriethoxysilane, propyltriethoxysilane, butyltriethoxysilane, isobutyl-triethoxysilane, pentyltriethoxysilane, and hexyltriethoxysilane.

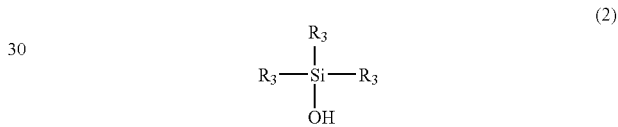
(2)

In general formula (2), $R_3$ represents an ethyl group.

Examples of the low-molecular silanol represented by general formula (2) include trimethylsilanol, triethylsilanol, tripropylsilanol, and tributylsilanol. More preferred is triethylsilanol.

The low-molecular silane (1) or the silanol (2) is mixed in such an amount as to result in a content thereof of from 10% by weight to 50% by weight based on the dry weight of the encapsulating material. Contents thereof lower than 10% by weight are undesirable because a reduced modulus of elasticity is not attainable. Contents thereof exceeding 50% by weight are undesirable because the encapsulating material becomes brittle.

The term "dry weight of the encapsulating material" means the weight of a material obtained by allowing the mixture solution comprising at least one low-molecular silane represented by the general formula (1) or at least one silanol represented by the general formula (2) and an alcohol solution containing an alkoxysiloxane to stand at room temperature for 2 days or longer and then curing it at 100° C. for 2 hours.

In S1, the mixture solution may be prepared by known methods. Examples thereof include a method in which the mixture solution is prepared in a draft environment. It is desirable to prepare the mixture solution preferably under clean-room conditions.

A fluorescent substance and a filler may be added to the mixture solution prepared in S1 (S2).

The fluorescent substance to be used in embodiments of the invention may be yellow fluorescent substance SOSE or BOSE constituted of elements selected from Sr, Ba, Eu, Ca, Si, and O or be YAG. The size of the fluorescent substance is preferably from 5 μm to 30 μm. Sizes thereof smaller than 5 μm are undesirable because such small sizes result in poor luminescent efficiency. Sizes thereof exceeding 30 μm are undesirable because such large particles show considerable sedimentation in the encapsulating material.

For using the mixture solution as an encapsulating material for light-emitting elements, it is necessary to evenly disperse fluorescent-substance particles having a given size in the mixture solution. For this purpose, a filler having a thickening effect is added. Examples of the filler include silica gel, alumina, kaolin clay, natural calcium silicate, synthetic calcium silicate, metal oxides, aluminum hydroxide, magnesium hydroxide, natural silica, talc, calcium carbonate, potassium titanate, lead titanate zirconate, barium titanate, aluminum nitride, boron nitride, hydrotalcite, zinc borate, aluminum borate, mica, basic magnesium sulfate, montmorillonite, and barium sulfate. One or more of these may be suitably selected. Although the filler may be composed of either spherical particles or particles formed by pulverization, pulverization particles have a higher thickening effect. The particle diameter of the filler is preferably from 0.001 μm to 0.1 μm, more preferably from 0.010 μm to 0.050 μm. Particle diameters thereof smaller than 0.001 μm are undesirable because such a fine filler is difficult to handle in clean rooms or the like. Particle diameters thereof exceeding 0.1 μm are undesirable because such a coarse filler has a reduced specific surface area and has a reduced thickening effect per unit weight of the filler added. The content of the filler may be from 10% by weight to 50% by weight based on the dry weight of the encapsulating material.

Besides the fluorescent substance and filler, a diffusing agent can be added. Examples of the diffusing agent include inorganic diffusing agents such as calcium carbonate, silica, silicones, zinc sulfide, zinc oxide, titanium oxide, titanium phosphate, magnesium titanate, mica, glass fillers, barium sulfate, clay, talc, silicone-rubber elastic materials, and polymethylsilsesquioxane. These substances serve to improve optical properties of light-emitting elements and enable the production of a light-emitting device which emits an even light.

The content of the diffusing agent may be about 0-10% by weight based on the dry weight of the encapsulating material. When the content thereof exceeds 10% by weight, there is a possibility that the diffusing agent might influence mechanical strength or light-emitting properties.

The mixture solution obtained may be kneaded with a rotation/revolution mixer (S3).

The rotation/revolution mixer is a stirring/defoaming machine of the type in which a vessel itself containing a material is "revolved" while being "rotated" and the material is thus mixed while being defoamed. A commercial one may be used. The time period of kneading may be about 5 minutes. This kneading may be conducted at room temperature in an atmospheric-pressure environment.

The mixture solution which has been kneaded in S3 is applied to a light-emitting element (S4).

Figure 2:
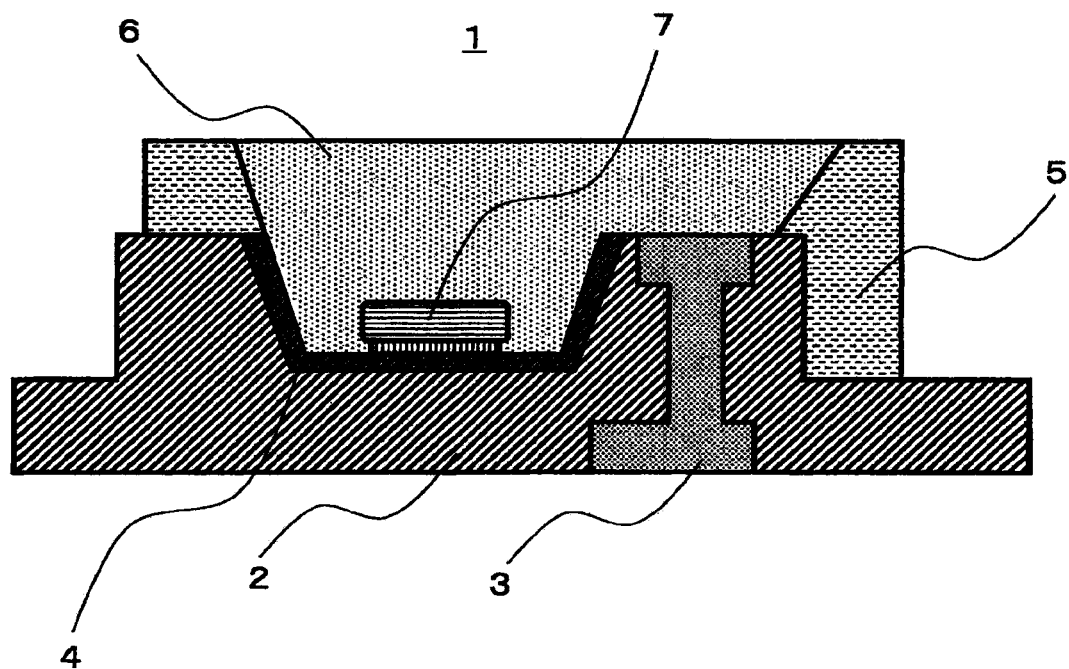
FIG. 2 is a diagrammatic sectional view of a light-emitting semiconductor device.

In FIG. 2 is shown an example of diagrammatic sectional views of a light-emitting semiconductor device. The light-emitting semiconductor device 1 includes a lead frame 2 and a light-emitting element 7 mounted in a recessed part 4 having a silver deposit on the surface thereof. The lead frame 2 is separated into two portions by an insulating resin 3. A die bonding material 5 has been formed on an upper part of the lead frame 2 so as to have a conical space therein, and the recessed part of the lead frame 2 and the conical space in the die bonding material 5 have been filled with an encapsulating material 6.

The light-emitting element 7 is constituted of a gallium nitride type compound which emits a light at wavelengths of 365-550 nm. In this embodiment, a blue-light-emitting GaN-based semiconductor element having an emitted-light wavelength peak at 440-470 nm is used. The blue-light-emitting semiconductor element is formed by a known method, e.g., the epitaxial growth method, on the lead frame 2 as a base containing sapphire, and is represented by $In_{(1-x)}Ga_xN$ ($0<x\leq1$). The mixture solution obtained in S3 is applied to the light-emitting element 7 to coat the upper side and lateral sides of the element 7.

The light-emitting semiconductor device 1 obtained in S4 is dried at room temperature (S5).

When heated in air or in an oxygen atmosphere, the mixture solution applied to the light-emitting semiconductor device 1 forms a transparent encapsulating material through the decomposition of a component or oxygen absorption.

The light-emitting semiconductor device 1 obtained in S5 is heated to cure the encapsulating material (S6).

The mixture solution containing a fluorescent substance is applied from over the light-emitting element 7 and injected into the recessed part 4 of the lead frame 2 and the conical space in the die bonding material 5. This mixture solution is then heated and cured at a temperature of about 150-200° C. The temperature at which the encapsulating material 6 is burned is sufficiently lower than the melting point of the bonding part of the light-emitting element 7. A lens part (not shown) for condensing the light emitted from the light-emitting element 7 and reflected by the surface of the recessed part 4 is formed over the encapsulating material 6.

It is desirable that after the upper side and lateral sides of the light-emitting element 7 have been coated, the recessed part of the housing 2 and the conical space in the die bonding material 5 are filled as an encapsulating material 6 with the same mixture solution. However, the recessed part and the conical space may be filled with another coating or encapsulating material.

Example 1

Sample Plate Production

Three milliliters of Telios Coat (manufactured by Nikko Inc.) was weighed out as an alcohol solution containing an alkoxysiloxane with a pipette and dropped onto an aluminum plate. Triethylsilanol as a low-molecular silanol was added thereto in an amount of 0.17 mL, which was 10% by weight based on the dry weight of an encapsulating material. Thus, a mixture solution was prepared.

The mixture solution was dried at ordinary temperature for 2 days. As a result, a composition was obtained in which the periphery and a central part were adherent to the aluminum plate and which had no warpage at all. This composition had an average thickness of 420 μm.

Production of Light-Emitting Semiconductor Device

In a glass vessel, Telios Coat was mixed with triethylsilanol in the same proportion as in producing the sample plate, and the resultant mixture was stirred with a rotation/revolution mixer for 5 minutes. The solution obtained was injected into the recessed part of a light-emitting semiconductor device, dried at ordinary temperature for 2 days, and then burned at 200° C. in a drying oven. The frequency of crack occurrence and film thickness of the encapsulating material obtained are shown in Table 1.

Example 2

The same procedure as in Example 1 was conducted, except that triethylsilanol was added in an amount of 30% by weight based on the dry weight of the encapsulating material. The frequency of crack occurrence is shown in Table 1.

Example 3

The same procedure as in Example 1 was conducted, except that triethylsilanol was added in an amount of 50% by weight based on the dry weight of the encapsulating material. The frequency of crack occurrence is shown in Table 1.

Comparative Example 1

Sample Plate Production

Three milliliters of Telios Coat was weighed out and dropped into an aluminum cup, and dried at room temperature for 2 days. As a result, a composition having warpage was obtained. Specifically, a peripheral part of this encapsulating material had lifted from the aluminum plate at a distance of about 5 mm, although the center of the encapsulating material was in contact with the plate.

Production of Light-Emitting Semiconductor Device

The same procedure as in Example 1 was conducted, except that triethylsilanol was added in an amount of 70% by weight based on the dry weight of the encapsulating material. No cracking was observed. However, the material obtained had poor transparency and was whitish and exceedingly brittle. This is thought to be attributable to a decrease in the number of Si—O bonds in the material.

Comparative Example 2

Telios Coat only was injected into the recessed part of a light-emitting semiconductor device, dried at ordinary temperature for 2 days, and then burned at 200° C. in a drying oven. As a result, the frequency of crack occurrence was 100%.

Comparative Example 3

Dodecylmethoxysilane was used as a low-molecular silane in an amount of 0.17 mL to prepare a mixture solution.

In the surface of the encapsulating material obtained, recesses and protrusions having a depth of about 2 mm were observed. Surface flatness was not ascertained. The frequency of crack occurrence after burning and the film thickness are shown in Table 1.

TABLE 1

| | Proportion of low-molecular silane or low-molecular silanol | Crack occurrence | Average film thickness (μm) |
|---|---|---|---|
| Example 1 | triethylsilanol 10 wt % | 0/5 | 75 |
| Example 2 | triethylsilanol 30 wt % | 0/5 | 70 |
| Example 3 | triethylsilanol 50 wt % | 0/5 | 73 |
| Comparative Example 1 | triethylsilanol 70 wt % | 0/5 | 70 |
| Comparative Example 2 | — | 5/5 | 65 |
| Comparative Example 3 | dodecyl methoxysilane 10 wt % | 5/5 | 60 |

What is claimed is:

1. A process for producing a light-emitting semiconductor device, comprising:
   (i) mixing at least one low-molecular silane represented by the following general formula (1) or at least one silanol represented by the following general formula (2) with an alcohol solution containing an alkoxysiloxane to prepare a mixture solution, the amount of the silane or silanol being from 10% by weight to 50% by weight based on the dry weight of an encapsulating material to be formed;
   (ii) applying the mixture solution to a light-emitting element;
   (iii) vaporizing the alcohol solvent in the mixture solution applied and drying the residual mixture to thereby form the encapsulating material; and
   (iv) curing the encapsulating material

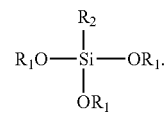

(1)

In general formula (1), $R_1$s each independently represent a methyl group or an ethyl group; and $R_2$ represents an alkyl group having 1-20 carbon atoms or a phenyl group which may have one or more hydrocarbon groups each having 1-8 carbon atoms

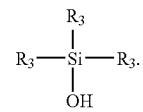

(2)

In general formula (2), $R_3$ represents an ethyl group.

2. The process of claim 1, wherein the mixture solution further comprises a fluorescent substance and a filler.

3. The process of claim 2, wherein the mixture solution comprises the fluorescent substance in an amount of from 40% by weight to 80% by weight based on the dry weight of the encapsulating material.

4. The process of claim 2, wherein the mixture solution comprises the filler in an amount of from 0.1% by weight to 20% by weight based on the dry weight of the encapsulating material.

5. The process of claim 2, wherein the fluorescent substance has an average particle diameter of from 5 μm to 30 μm.

6. The process of claim 2, wherein the filler has an average particle diameter of from 0.001 μm to 0.1 μm.

* * * * *